US006222431B1

(12) United States Patent
Ishizaki et al.

(10) Patent No.: US 6,222,431 B1
(45) Date of Patent: Apr. 24, 2001

(54) BALANCED DIELECTRIC FILTER

(75) Inventors: Toshio Ishizaki, Kobe; Toru Yamada, Katano; Hideaki Nakakubo, Soraku-gun; Shoichi Kitazawa, Nishinomiya, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/255,790

(22) Filed: Feb. 23, 1999

(30) Foreign Application Priority Data

Feb. 27, 1998 (JP) ..................................... 10-047793

(51) Int. Cl.[7] ..................... H01P 1/20; H03H 5/00

(52) U.S. Cl. ..................... 333/206; 333/202; 333/204; 333/26

(58) Field of Search ..................... 333/202, 204, 333/203, 206, 26

(56) References Cited

U.S. PATENT DOCUMENTS 5,489,882 * 2/1996 Ueno ..................... 333/206
6,020,799 * 2/2000 Ishizaki et al. ..................... 333/204

FOREIGN PATENT DOCUMENTS 5-95202 4/1993 (JP) .
7-312503 11/1995 (JP) .
WO 92-02969 2/1992 (WO) .

* cited by examiner

*Primary Examiner*—Robert Pascal
*Assistant Examiner*—Patricia T. Nguyen
(74) *Attorney, Agent, or Firm*—Wenderoth, Lind & Ponack, L.L.P.

(57) ABSTRACT

The present invention relates to a balanced dielectric filter used in high-frequency circuits, such as those used for radio apparatuses, and provides a balanced dielectric filter having balanced input/output terminals. Namely, the balanced dielectric filter comprises two resonators, each comprising plural strip-line resonating elements, disposed in parallel and mutually coupled electro-magnetically, and input and output terminals coupled to each resonator so as to function as a pair of balanced input terminals and a pair of balanced output terminals, wherein the two resonators are located in a ceramic dielectric to face each other and to be mirror images of each other. The resonating element is a quarter-wavelength resonating element, the end of the strip line thereof is grounded. The strip lines and coupling electrodes are arranged among ceramic layers, whereby the filter is integrated into a ceramic-multilayered structure.

18 Claims, 9 Drawing Sheets

BALANCED DIELECTRIC FILTER

FIELD OF THE INVENTION

The present invention relates to a balanced dielectric filter mainly used for high-frequency circuits, such as those used for radio communication apparatuses.

PRIOR ART

In accordance with the recent progress of mobile communications including the cellular phone system, filters have been required to be more compact in size and higher in performance, and dielectric filters suited for these requirements have been used widely. Such dielectric filters are used in a microwave band ranging from a few hundred megahertzs to about five gigaherzs, which are mounted on circuit boards in communications equipment, in particular, in the cellular phones. For this purpose, ceramic-multilayered filters have been used in larger quantity to be suited to be made especially smaller and thinner.

FIG. 9B shows the structure of a conventional unbalanced dielectric filter in which five ceramic dielectric layers 61 to 65 are laminated into a multilayer structure. Between the dielectric layers 63 and 64, a resonator comprising a pair of strip lines 66, 66 as a resonator is formed on a plane in the structure, and the strip lines have lengths of a quarter of a resonant wavelength with short-circuited ends.

In this example, an input capacitance electrode 68 is coupled to one end of one of the strip lines 66, and an output capacitance electrode 69 is coupled to one end of the other strip lines 66. The two strip lines as resonating elements are disposed in parallel and coupled electrostatically through an interstage-coupling capacitance electrode 70.

The resonator of the strip lines 66 and 66 is interposed between two shield electrodes 71, 72 through dielectric layers, thereby forming a tri-plate structure. The strip lines 66 and 66 in a pair are grounded through a loading capacitance electrode 67. Furthermore, an input terminal 73 (11) and an output terminal 74 (51) are connected to the one and the other of the strip lines 66, respectively, through the input capacitance electrode 68 and the output capacitance electrode 69, respectively. Moreover, grounding terminals 75, 76 (4) are connected to the shield electrodes 71, 72 and the above loading-capacitance electrode 67 so that they are grounded.

FIG. 9A is a view showing the connections of the terminals to the conventional dielectric filter. A high-frequency input signal is applied between the input terminal 11 and the grounding terminal 4, and then an output signal is delivered between the output terminal 51 and the grounding terminal 4.

In the dielectric filter as described above, the two strip lines 66 and 66 of the resonator are first coupled electromagnetically to each other to form a comb-line type filter. The loading-capacitance electrode 67 is used to connect a capacitance in parallel with the strip lines, thereby lowering the resonant frequency for the strip line having the same length.

In this filter, the input and output stages of the filter are capacitance coupling, and parallel-plate capacitors are formed at the portions of the input/output capacitance electrode 68, 69 on the dielectric layer opposed to the strip-line resonator 66. The interstage-coupling capacitance electrode 70 can attain the interstage coupling between the strip line resonators by combining electromagnetic field coupling with electric field coupling, then, generating an attenuation pole in transfer characteristics (see Japanese Patent Publication JP-A 5-95202, for example).

An unbalanced filter using stepped impedance resonators integrally formed in a dielectric ceramic-multilayered structure is disclosed in Japanese Patent Publication JP-A 7-312503. In this filter, a pair of strip lines are stepped impedance resonators, each comprising a first line portion, one end of which is grounded, and a second line portion, one end of which is open, and which has a characteristic impedance lower than that of the first line portion. The coupling factor between the first line portions and the coupling factor between the second line portions are changed to control the transfer characteristics of the filter circuit.

Furthermore, as still another conventional example, an attempt to balance the output and/or input terminal arrangement of the filter has already been proposed in PCT international publication WO92/02969, as shown in FIG. 10. In this example, the filter comprises two split ring resonators 80 and 81 of a microstrip-line type, wherein one of the resonators is connected to an unbalanced input terminal 82 through an input coupling capacitance 85, and the other resonator is connected to balanced output terminals 83, 84. The split ends of the rings are connected to each other by loading capacitances 86 and 87, respectively. In this arrangement, the split-ring resonators 80, 81 are coupled electromagnetically to form a filter.

In the conventional strip-line type filters described above, since the input terminals are unbalanced, a balance-unbalance transformer (BALUN) is required to connect the unbalanced terminals to a high-frequency balanced amplifier or semiconductor integrated circuit. Furthermore, in the unbalanced circuit, current flows in the grounding circuit thereof, thereby causing a problem of having low resistance against electromagnetic interference and being easily susceptible to noise or the like.

Furthermore, the PCT international publication WO92/02969 discloses another embodiment of a filter using a pair of the ring strip resonators with balanced input and output terminals. This balanced filter must occupy a large area on the dielectric substrate to locate the twin resonators on the same surface. Therefore, a new type of balanced filters with more compact sizes is eagerly desired and it is required to arrange the resonators compactly for fabricating a balanced filter.

SUMMARY OF THE INVENTION

An object of the present invention is to provide a dielectric filter having balanced input and output terminals, being highly resistant against electromagnetic interference and capable of being designed easily.

Another object of the present invention is to provide a balanced dielectric filter having excellent characteristics for connection to balanced circuits or balanced integrated circuits.

Yet another object of the present invention is to provide a balanced dielectric filter being mountable efficiently on circuit boards.

The balanced dielectric filter in accordance with the present invention comprises two resonators, each comprising plural TEM mode resonating elements which are disposed in parallel and mutually coupled electromagnetically, two input terminals each of which is connected to the corresponding resonator, and two output terminals each of which is connected to the corresponding resonator, functioning as balanced input and output terminals, wherein the two resonators are disposed in a dielectric to face each other and to have mirror symmetry with each other.

In the balanced dielectric filter in accordance with the present invention, both the input and output terminals are of a balanced type, and the two resonators are disposed so as to be mirror images of each other. When high-frequency signals opposite in phase are applied to the two input terminals of the two resonators, an electric wall having the zero potential is formed in the mirror-symmetry plane between the two resonators. Therefore, both the input and output sides of the filter are balanced excellently. External electromagnetic interference is cancelled, and not produced on the output side. As a result, it is possible to configure a filter highly resistant against external electromagnetic interference.

In the present invention, the TEM mode resonating element comprises a strip line formed of a thin conductor embedded in a dielectric.

A hollow resonator included in a dielectric may be used as another type of TEM mode resonating element. In this case, holes, acting as resonant cavities, arranged in a dielectric block may be used to constitute a dielectric block type balanced filter.

The strip-line resonating elements may act as a quarter-wavelength resonator, the ends of the strip lines thereof formed of a conductor being grounded. More particularly, the filter of the present invention comprises a pair of resonators having plural strip lines as a resonating element disposed in parallel and mutually coupled electromagnetically. The resonators of the plural strip lines are disposed so as to be mirror images of each other in a dielectric and each acts as a quarter-wavelength resonator. Both ends on the input sides of the strip lines in the two resonators are connected to both of the input terminals, respectively, and a pair of output terminals are connected to both ends on the output sides of the resonator.

The strip lines of each of the two resonators, being symmetrical to each other, may be connected to each other at the ends of the strip lines so as to form a half-wavelength resonator. In other words, the present invention includes a balanced dielectric filter comprising a strip line producing half-wavelength resonance, being bent to be mirror-image symmetrical.

More specifically, the balanced dielectric filter comprises plural strip-line resonating elements disposed in parallel and mutually coupled electromagnetically, a pair of input terminals connected to both end sides of the resonating elements on the input side, respectively, and a pair of output terminals connected to both end sides of the resonating elements on the output side, wherein the resonating elements are connected to form a bent shape so as to be mirror images of each other and located in a dielectric.

Particularly, in this balanced dielectric filter, both strip lines, having been bent, are disposed so as to be face-to-face with relation to mirror images of each other. Therefore, an electric wall is formed on the mirror symmetry plane in the dielectric filter, and both the input and output sides of the filter can remain almost completely balanced.

In the above-mentioned strip-line resonator, the electric wall is formed on the mirror-symmetry plane between the bent strip lines. However, the electric wall may be an imaginary wall without any conductor. Preferably, an intermediate shield of a metallic conductor should be located on the electric wall and grounded, whereby the filter circuit can be securely balanced.

In order to form the filter, two strip-line resonators are independently disposed so as to be symmetrical to each other in a dielectric ceramic-multilayered structure. In other words, each resonator is formed on the top and bottom sides of a ceramic layer so that two set of quarter-wavelength strip-line conductors face each other. In each of the these two resonators, the strip-line conductors adjacent to each other are located in parallel with each other with a small clearance therebetween to be coupled electro-magnetically.

Furthermore, the input/output capacitance electrodes of the resonators are located separately on other dielectric ceramic layers adjacent to the resonators, and electrically coupled to the ends of the strip lines, respectively. As described above, two resonators, input/output capacitance electrodes, and coupling capacitance electrodes between the resonators when required are integrated into a ceramic-multilayered structure, whereby a compact filter structure can be attained.

The present invention can attain a balanced filter being compact in size and excellent in performance by electromagnetically coupling quarter-wavelength resonating elements formed of strip lines in a dielectric ceramic-multilayered structure as described above. Furthermore, the present invention can attain a compact balanced dielectric filter formed of two half-wavelength resonators, each obtained by connecting the ends of the two strip lines of the quarter-wavelength resonating elements in a folded-back form. Moreover, an imaginary electric wall is attained on the basis of electric symmetry between the resonators by providing a multilayered structure having resonators among dielectric ceramic layers. As a result, the filter can be made compact in size, excellent in performance and balanced on both the input and output sides.

The balanced dielectric filter with accordance to the present invention can preferably be used as a band pass filter in a frequency range of a few hundred megahertzs to about five gigahertzs in a microwave band which is mounted on circuit boards in communications equipment, in particular, in cellular phones.

BRIEF DESCRIPTION OF THE DRAWINGS

The present invention will be described below in detail referring to the accompanying drawings, in which.

DETAILED DESCRIPTION AND EMBODIMENTS OF THE INVENTION

Figure 1A:
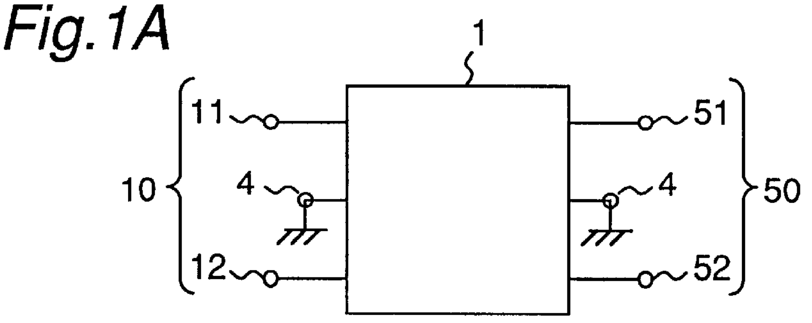
FIG. 1A shows a block diagram of the connections of input/output terminals of a balanced dielectric filter.

FIG. 1A shows a block diagram of a balanced dielectric filter to illustrate the operation of each embodiment of the present invention. Referring to this figure, a pair of balanced input terminals 11 and 12 and a pair of balanced output terminals 51 and 52 are connected to a balanced dielectric filter 1 with grounding terminals 4 and 4 further connected to the input side and the output side, respectively, of the filter.

An input signal is applied across the two terminals 11, 12 used as balanced input terminals 10 in opposite phase, the grounding terminal 4 on the input side is essentially at the zero potential at all times, and no grounding current flows to the grounding terminal 4. In the same way, an output signal is produced across a pair of balanced output terminals 50 (51 and 52) in opposite phase, the grounding terminal 4 on the output side is essentially at the zero potential at all times, and no grounding current flows to the grounding terminal 4.

Figure 1B:
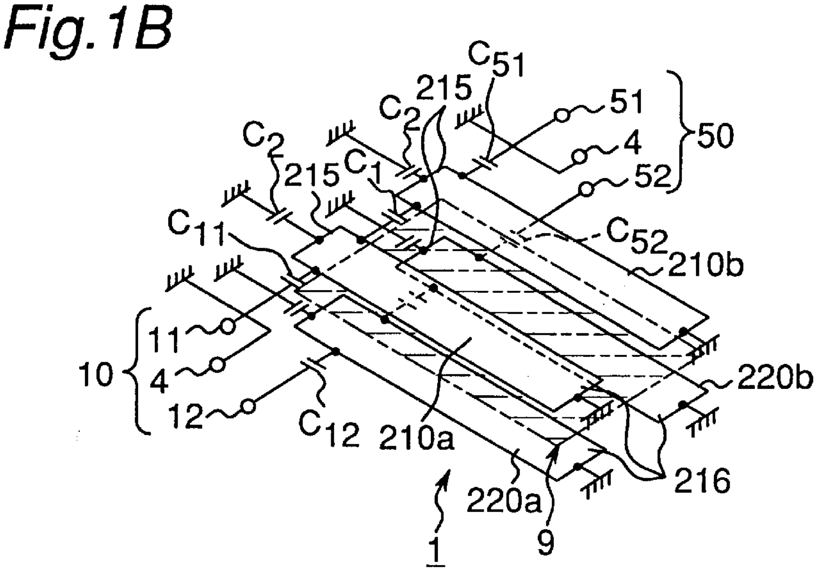
FIGS. 1B and 1C are equivalent circuits of balanced dielectric filters in accordance with the present invention.
Figure 1C:
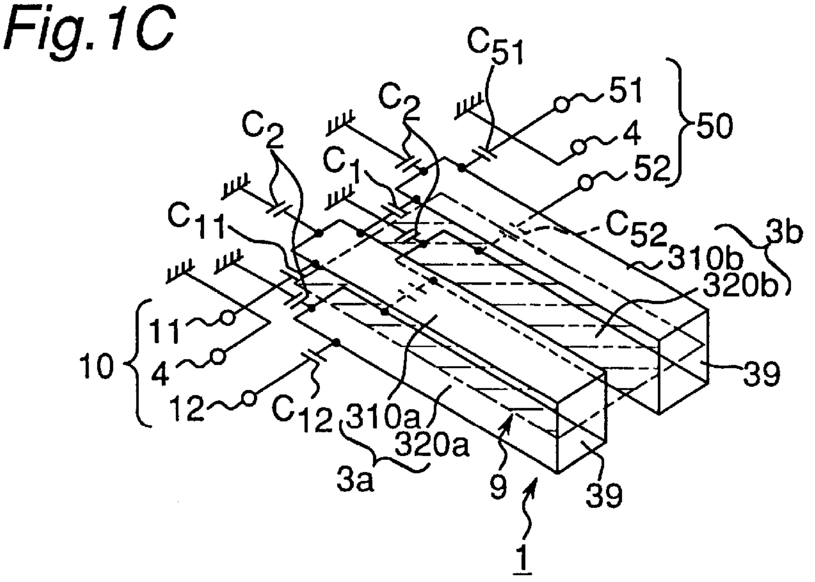

In order to attain this kind of filter balanced on both the input and output sides, FIGS. 1B and 1C are schematic views showing the balanced dielectric filter 1 of the present invention.

Referring to FIG. 1B, the filter is provided with balanced input/output terminals 10 and four quarter-wavelength resonating elements constituting two resonators. The balanced dielectric filter in accordance with the present embodiment has pairs of strip lines (210*a* and 210*b*) and (220*a* and 220*b*) of the two resonators, and every two of these strip lines are located in parallel and coupled to each other electromagnetically. On one end sides of these strip lines, the input terminals 11 and 12 and the output terminals 51, 52 are connected in parallel through a coupling capacitor C1, and the other end sides of the strip lines are grounded, thereby to form the quarter-wavelength resonating elements.

One end of a first resonating element 210*a* is coupled to the positive terminal 11 of the balanced input terminals 10, and one end of a second resonating element 220*a* is coupled to the negative terminal 12. One end of a third resonating element 210*b* is coupled to the positive terminal 51 of the balanced input terminals 50, and one end of a fourth resonating element 220*b* is coupled to the negative terminal 52. The other ends of all the resonating elements are grounded electrically.

Furthermore, the strip lines of the resonating elements 210*a*, 210*b* used in a pair are disposed to face the resonating elements 220*a* and 220*b* used as another pair with a clearance therebetween so as to be mirror images of each other. With this configuration, input signals to the pair of the input terminals 11 and 12 pass through input capacitors C11 and C12, respectively, and applied to the two pairs of the resonating elements 210*a*, 210*b* and 220*a*, 220*b* in opposite phase. However, in the resonators, each of the pairs of the strip lines is coupled electro-magnetically, independently of other to filtrate each signal in a constant frequency range. The resonators are connected to the output terminals through the output capacitors C51 and C52, and filtrated signals being in opposite phase are output from the resonators to the output terminals.

The resonating elements 210*a* and 220*a* face each other, and the resonating elements 210*b* and 220*b* also face each other. Input signals applied to the resonators are opposite in phase (difference of 180° in phase). Therefore, the strip lines of the resonators 210 and 220 have the same potential, with opposite signs with respect to a mirror-symmetry plane between the resonators, at any positions corresponding to each other, whereby both the resonators are balanced completely.

The above-mentioned symmetry plane has the zero potential at all times, which is considered to be an imaginary electric wall 9. In particular, it is desired that an intermediate shield electrode 271 is located at the position of the electric wall 9 between the resonators 210 and 220, and is grounded.

Because the resonators are electrically symmetrical with respect to the intermediate shield electrode 271, even if external magnetic or electric field are applied to the resonators 210 and 220, the field is cancelled no to appear on both the input and output sides of the filter, thereby obtaining the filter made completely balanced.

FIG. 1C shows another embodiment of a balanced filter. In resonators 3*a*, 3*b*, half-wavelength strip lines 3*a* and 3*b* used in a pair are disposed in parallel, coupled electromagnetically to each other, and are folded so that the halves 310*a* and 320*a* of the strip line 3*a* are disposed to be mirror images of each other. A pair of input terminals are connected to both ends of one of the strip lines, through input capacitors C11 and C12. Also, a pair of output terminals are connected to both ends of the other strip line, through output capacitors C51 and C52. In this embodiment, the midpoint 39 of the strip line is not grounded. However, a standing wave of current appears at the zero potential (voltage node). The symmetry plane between the halves of the folded strip and the above-mentioned midpoint of the strip line has the zero potential at all times, this plane being an imaginary electric wall 9. In this case, it is also desired that a shield electrode 271 is located at the position of the electric wall 9 between the resonators 310*a* and 320*a*, and between the resonators 310*b* and 320*b*.

The space between the resonators 210, 220 and the peripheral portions thereof are supported and integrated in a multilayered condition by using ceramic sheets having excellent high-frequency characteristics as a dielectric as described below.

Furthermore, an interstage-coupling capacitance C1 is coupled across the strip lines disposed in a pair and in parallel to form an attenuation pole adjacent to a pass band. In addition, the ends on the input/output sides of the strip lines are grounded through loading capacitors C2, whereby the lengths of the strip lines can be made shorter than the length of resonance.

An outstanding feature of this arrangement of the filter is that no grounding current flows at the balanced input/output terminals. In an extreme condition, that is, without grounding terminals, this arrangement acts normally as a balanced four-terminal filter circuit.

In this respect, this balanced filter significantly differs from an unbalanced filter that requires ideal grounding to attain a normal filter characteristic, i.e., a high attenuation level. In the case of the unbalanced filter, ideal grounding is hardly attained in an actual high-frequency circuit, whereby the characteristics of the dielectric filter are deteriorated.

In the case of the balanced dielectric filter of a balanced input/output type, excellent filter characteristics can be obtained at all times regardless of grounding condition.

In the descriptions of embodiments described below, as disclosed in Japanese Patent Publication JP-A 7-312503, two or more strip lines, each comprising a wide strip portion and a narrow strip portion being integrated in series, are arranged, the wide strip portions are coupled electromagnetically to each other, and the narrow strip portions are also coupled electromagnetically to each other to form a quarter-wavelength resonator and a half-wavelength resonator.

Embodiment 1

Figure 2:
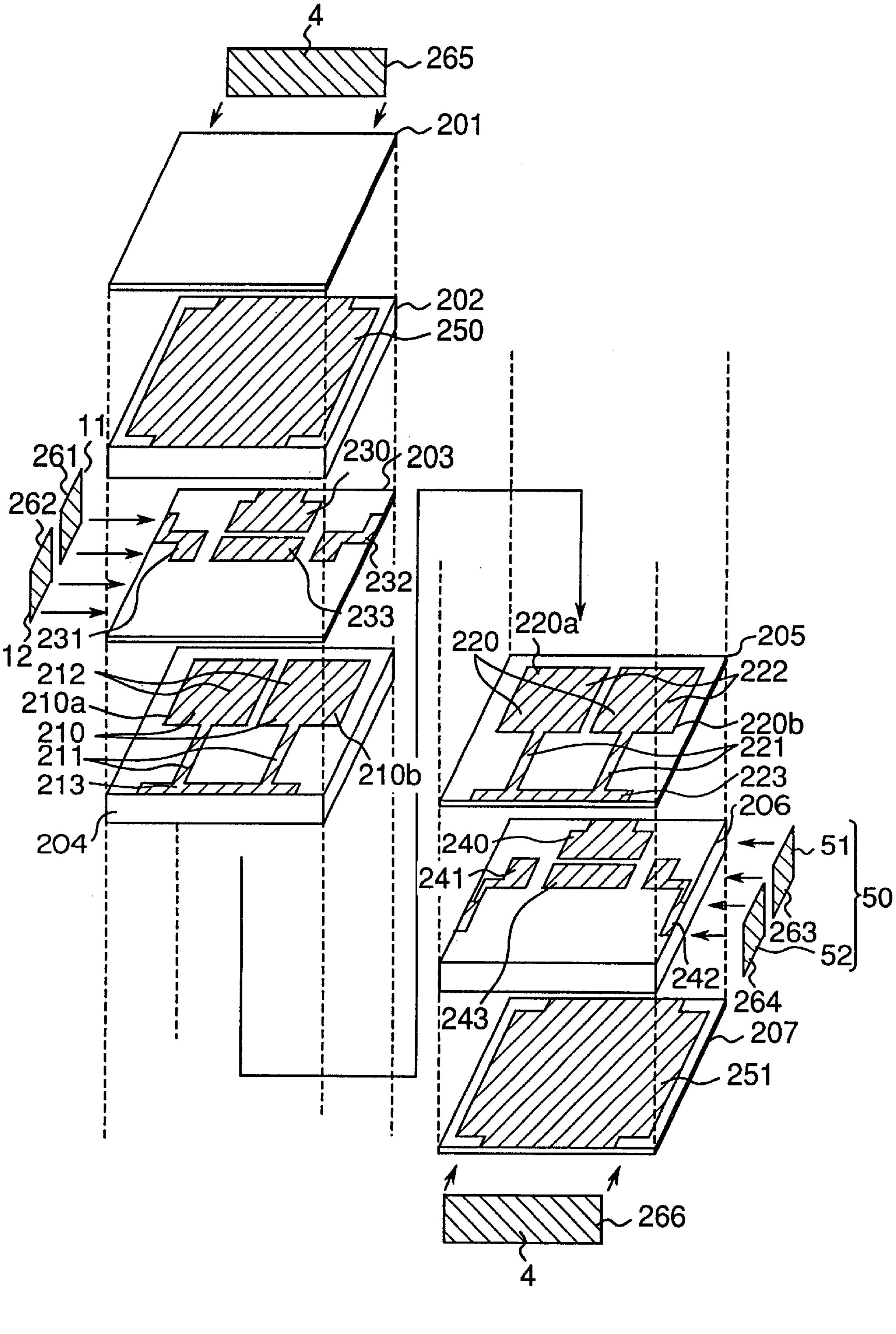
FIG. 2 is an exploded view showing a balanced dielectric filter having balanced input/output terminals in accordance with an embodiment of the present invention.

FIG. 2 is an exploded view showing the configuration of a balanced dielectric filter having balanced input/output terminals in accordance with a first embodiment of the present invention. This filter comprises seven layers 201 to 207 of laminated dielectric ceramic sheets. Two strip-line resonators 210 and 220, provided separately in the vertical direction, are located on the ceramic sheets 204 and 205, respectively. In these strip-line resonators 210 and 220, provided separately in the vertical direction, the strip lines thereof face each other so as to be mirror images of each other.

Furthermore, on the ceramic sheet 203 above the resonator 210, an input capacitance electrode 231, an output capacitance electrode 232, an interstage-coupling capacitance electrode 233 and a loading-capacitance electrode 230 are formed, and these capacitance electrodes are coupled with the strip-line resonator 210.

In the similar way, on the ceramic sheet 206 below the lower resonator 220, an input capacitance electrode 241, an output capacitance electrode 242, an interstage-coupling capacitance 243 and a loading capacitance electrode 240 are formed, and these capacitance electrodes are coupled with the strip-line resonator 220.

In this example, each of the resonators 210 and 220 comprises a pair of strip-line resonating elements. In a pair of strip-line resonating elements 210*a*, 210*b* and another pair of strip-line resonating elements 220*a*, 220*b*, two parallel narrow line portions 211 are connected to two parallel wide line portions 212, and two parallel narrow line portions 221 are connected to two parallel wide line portions 222. The input capacitance electrode 241 and the output capacitance electrode 242 are electrostatically coupled to the wide line portions. The ends of the two parallel narrow portions of the resonator 210 are connected to a common grounding terminal 213, and the ends of the two parallel narrow portions of the resonator 220 are connected to a common grounding terminal 223. The two parallel narrow line portions 211, 221 are coupled electromagnetically to each other, and the two parallel wide line portions 212, 222 are also coupled electromagnetically to each other. At the same time, the wide line portions 212 are coupled electrostatically through the interstage-coupling capacitance 233, and the wide line portions 222 are also coupled electrostatically through the interstage-coupling capacitance 243.

The electrodes and the strip lines mentioned above are held between shield electrodes 250 and 251 in the vertical direction. Input terminals 261 (11) and 262 (12) are formed in a pair on one side of the multilayered filter and connected to the input capacitance electrodes, and output terminals 263 (51) and 264 (52) are formed in a pair on the other side of the multilayered filter and connected to the output capacitance electrodes. Furthermore, in the case of this embodiment, input/output grounding electrodes 265 and 266 (4) are provided so as to be connected to the shield electrodes 250 and 251, an intermediate electrode 271 and the grounding electrodes 213 and 223.

In the two resonators of the present invention, that is, the resonator 210 (resonating elements 210*a* and 210*b*) and the resonator 220 (resonating elements 220*a* and 220*b*), the two strip lines, each comprising the wide line portion 212 and the narrow line portion 211 coupled to each other, are provided in parallel. Furthermore, the two strip lines, each comprising the wide line portion 222 and the narrow line portion 221 coupled to each other, are provided in parallel. The resonating elements used in a pair for one of the two resonators are located separately from the resonating elements used in a pair for the other resonator in the vertical direction so as to face each other and to be mirror images of each other. With this configuration, an input signal supplied to the input terminal 261 passes through the input capacitance electrode 231 and is applied to the resonator 210, and an input signal supplied to the input terminal 262 passes through the input capacitance electrode 241 and is applied to the resonator 220. The resonating elements of the resonator 210 and those of the resonator 220 are independently coupled electromagnetically, and filtration is carried out in a constant frequency range. Each resonator is connected to the output terminal through the output capacitance electrode corresponding thereto, and filtration signals being 180 degrees out of phase with each other are output to the output terminals of the resonators.

The resonators 210, 220 are disposed to face each other, and input signals applied to the resonators are opposite in phase (180 degrees out of phase). Therefore, the potential on the strip line of one of the resonators is the same as that on the strip line of the other resonator, but opposite in sign with respect to the symmetry plane between the resonators 210, 220 at any positions on the strip lines corresponding to each other, whereby both the resonators are balanced completely. The symmetry plane 9 has the zero potential at all times, and this surface becomes an imaginary electric wall. In the present embodiment, an intermediate shield electrode described below is not formed, whereby high-frequency current does not flow through such an intermediate shield electrode. As a result, the present embodiment is advantageous in that filter-passing loss is low, and filter production is attained simply.

A filter is produced as described below. Silver paste is applied into thick films printing onto green sheets of ceramic material such as, for example, Bi—Ca—Nb—O based ceramic in order to form patterns of resonators and electrodes, and the plural green sheets are laminated and then fired to an integrated ceramic filter.

Figure 3:
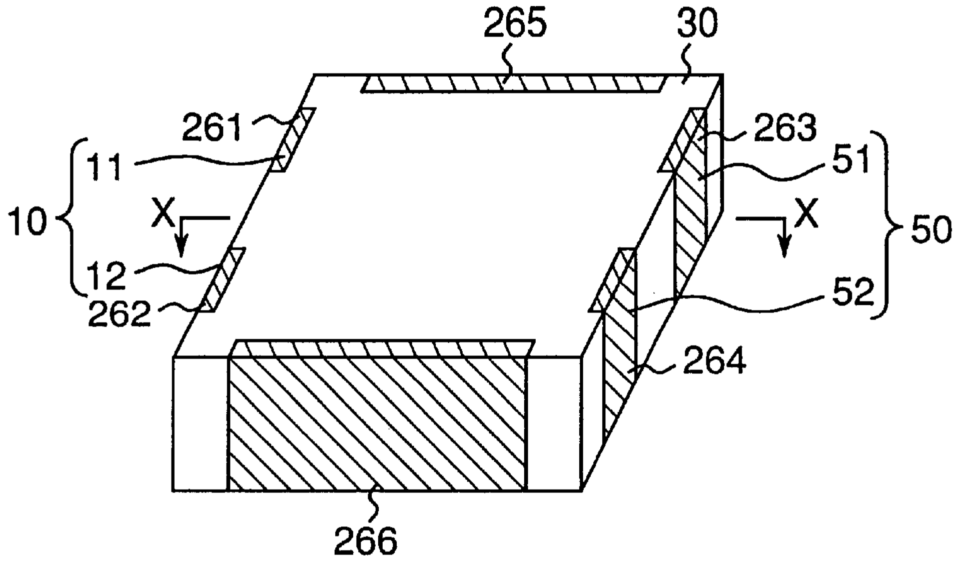
FIG. 3 is an exploded view of a multilayered filter in an embodiment showing an arrangement of strip lines and electrodes on sheets in a dielectric filter in accordance with the present invention.

FIG. 3 is an exploded view showing an arrangement of strip lines and electrodes located on every sheet in a ceramic-multilayered filter having balanced input/output terminals in accordance with the present embodiment. Input electrodes 261, 262 are formed in a pair on one side of the filter, and these are used as input terminals 11, 12, respectively. In addition, output electrodes 263, 264 are formed in a pair on the opposite side thereof, and these are used as output terminals 51, 52, respectively. Furthermore, a grounding electrode 265 is formed so as to be exposed on another side of the filter, and a grounding electrode 266 is also formed so as to be exposed on the opposite side thereof, and these grounding electrodes are used as a grounding terminal 4.

Figure 4:
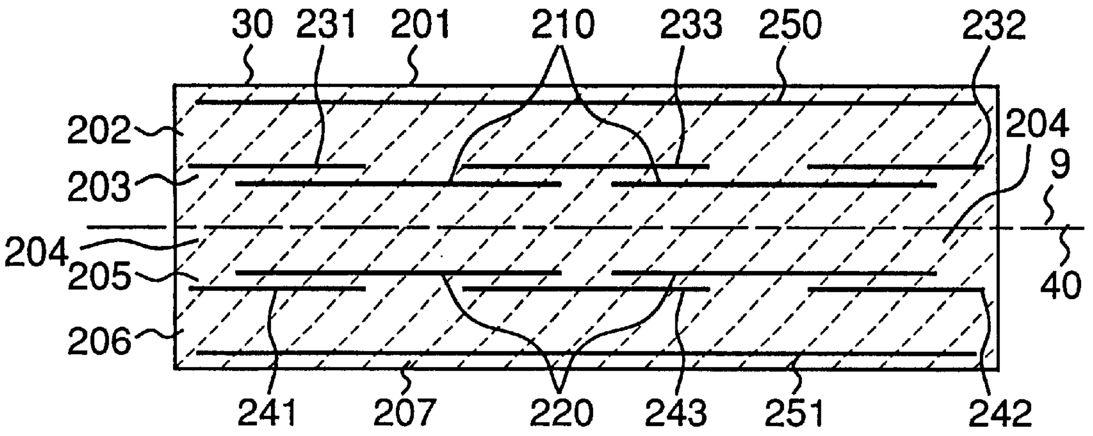
FIG. 4 is a vertical sectional view showing the balanced dielectric filter having a ceramic-multilayered structure in accordance with the embodiment of the present invention.

FIG. 4 is a sectional view showing the filter of a ceramic-multilayered structure in accordance with the present embodiment. Referring to this figure, electrodes are disposed symmetrical with respect to a mirror-image symmetry plane 40 in the vertical direction, and the imaginary electric wall 9 is formed on the symmetry plane.

Embodiment 2

In the case of a second embodiment of the present invention, an intermediate shield electrode is formed at the position of the electric wall 9 in addition to the electrodes located in the balanced dielectric filter having the balanced input/output terminals in accordance with the first embodiment.

Figure 5:
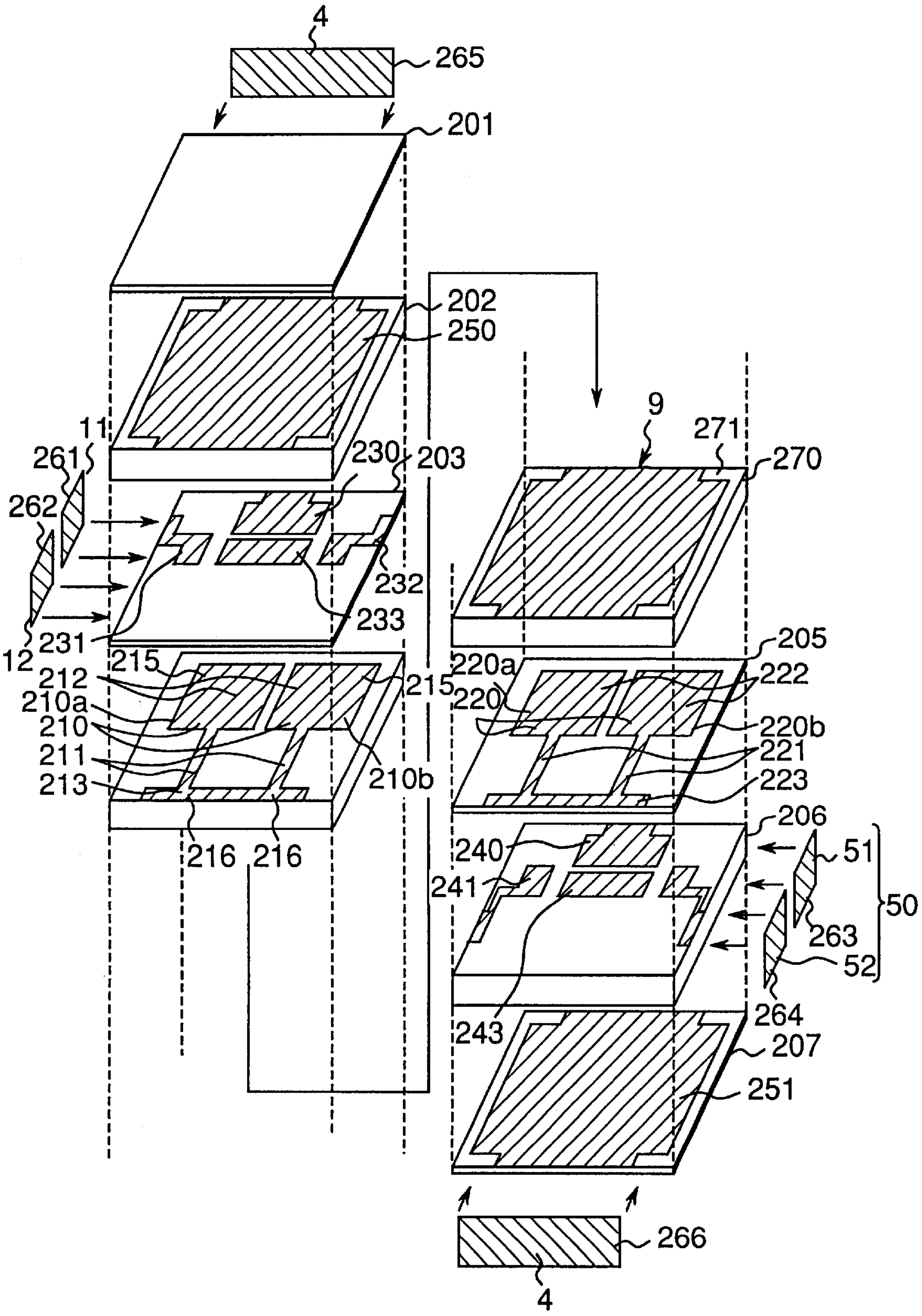
FIG. 5 is a view similar to FIG. 2 showing a balanced dielectric filter having balanced input/output terminals in accordance with another embodiment of the present invention.

Referring to FIG. 5, in a balanced dielectric filter in accordance with the second embodiment, an intermediate shield electrode 271 is located between the two strip-line resonators 210, 220 in accordance with the above-mentioned embodiment. The intermediate shield electrode 271 is positioned nearly close to the symmetry plane 40 between the two strip-line resonators 210, 220 located in the vertical direction and grounded.

This filter of the present embodiment is the same as the filter of the first embodiment except that the intermediate shield electrode 271 is provided so as to act as the electric wall 9 between the resonators 210, 220. This filter is electrically symmetrical with respect to the electric wall 9 in the vertical direction as described in the explanation of the first embodiment. Since this filter is electrically symmetrical with respect to the shield electrode 271, even if external magnetic and electric fields are exerted on the filter, such fields are not produced at the input and output of the filter.

Embodiment 3

Figure 6:
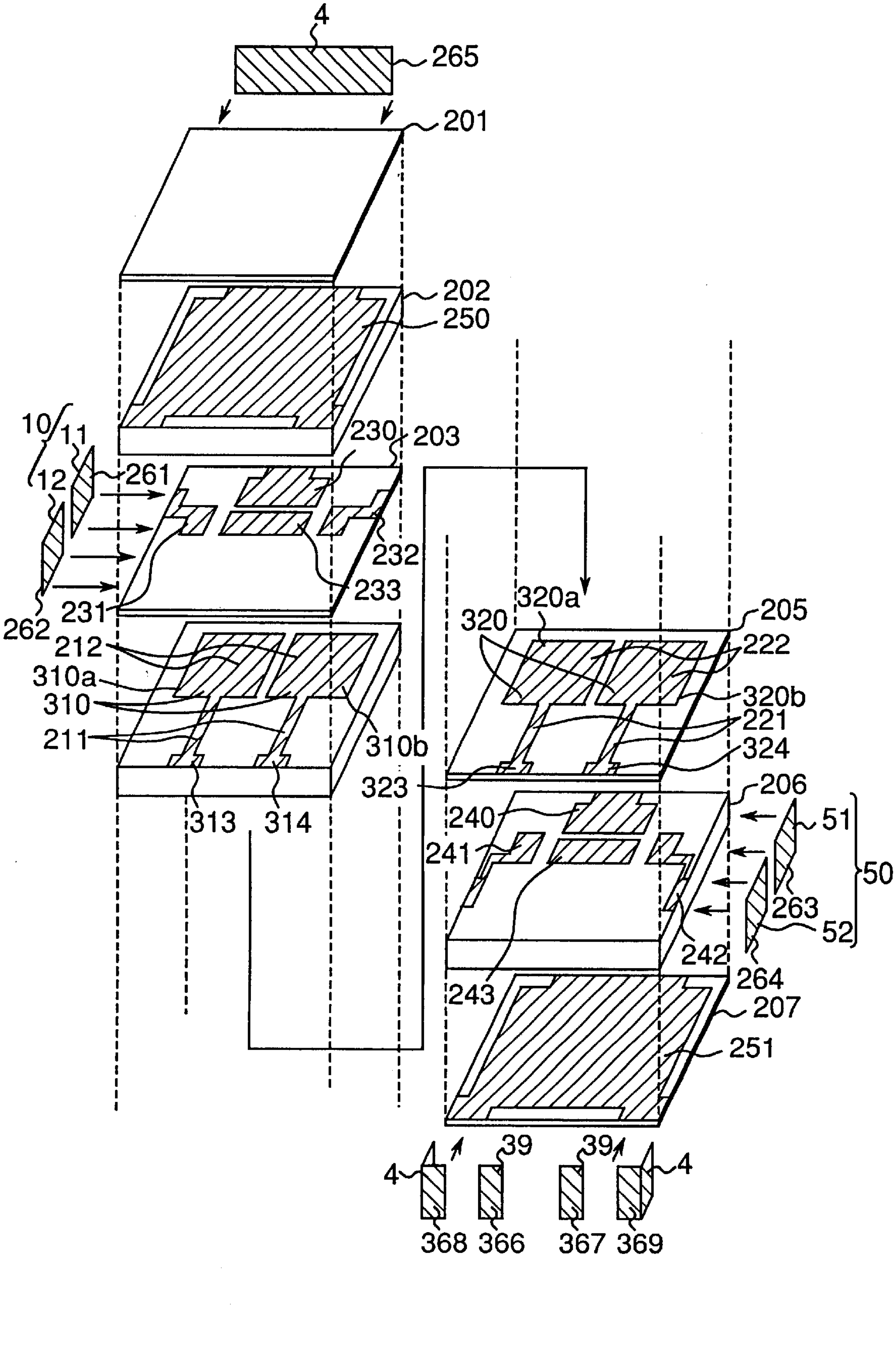
FIG. 6 is a view similar to FIG. 2 showing the structure of a balanced dielectric filter in accordance with yet another embodiment of the present invention.

FIG. 6 is a view showing another structure of a balanced dielectric filter having balanced input/output terminals in accordance with the present embodiment. This dielectric filter comprises multilayers of dielectric ceramic sheets 201 to 207. Two resonators, that is, a resonator 310 (resonating elements 310*a*, 310*b*) and a resonator 320 (resonating elements 320*a*, 320*b*), are formed as strip lines having a nearly quarter-wavelength.

The resonators are detailed as follows. The wide line portions 212 comprising two parallel strip lines are coupled electromagnetically to the wide line portions 222 comprising two parallel strip lines. The narrow line portions 211 comprising two parallel strip lines connected to the wide line portions 212 are coupled electromagnetically to the narrow line portions 221 comprising two parallel strip lines connected to the wide line portions 222. The ends of the two narrow line portions 211 are connected to connection electrodes 313 and 314, respectively, and the ends of the two narrow line portions 221 are connected to connection electrodes 323 and 324, respectively. Furthermore, the connection electrode 313 is connected to the connection electrode 323 through a short-circuit electrode 366, and the connection electrode 314 is connected to the connection electrode 324 through a short-circuit electrode 367, thereby forming a pair of half-wavelength strip lines.

On the input sides of the wide line portions 212, 222, input capacitance electrodes 231, 241 are located respectively through a dielectric ceramic layer. On the output sides of the wide line portions 212, 222, output capacitance electrodes 232, 242 are located respectively through the dielectric ceramic layer. Furthermore, above the pair of the wide line portions 212, a loading-capacitance electrode 230 and an interstage-coupling capacitance electrode 233 are located on a dielectric ceramic layer 203. Below the pair of the wide line portions 222, a loading capacitance electrode 240 and an interstage-coupling capacitance electrode 243 are located on a dielectric ceramic layer 206. With this configuration, capacitances are formed between these capacitance electrodes and the wide line portions. Moreover, a shield electrode 250 is formed on a dielectric ceramic layer 202 above the capacitance electrodes 230, 233, and a shield electrode 251 is formed on a dielectric ceramic layer 207 below the capacitance electrodes 240, 243.

The input capacitance electrodes 231, 241 are connected to input terminals 261, 262, respectively. The output capacitance electrodes 232, 242 are connected to output terminals 263, 264, respectively. These input/output capacitance electrodes are formed on two sides of the ceramic-multilayered filter. On the other two sides of the multilayered filter, grounding terminals 265, 368, 369 are formed and connected to the shield electrodes 250, 251. A terminal electrode 366 is a connection end electrode used to connect the connection electrodes 313 and 323, and a terminal electrode 367 is a connection end electrode used to connect the connection electrodes 314 and 324.

A dielectric filter is produced as described below. A dielectric ceramic green sheet of Bi—Ca—Nb—O ceramic material for example is formed. Silver paste is applied by thick film printing onto each sheet to form electrode and strip line patterns having predetermined shapes. The green Sheets are laminated and then fired, which is integrated into a ceramic-multilayered filter.

Figure 7:
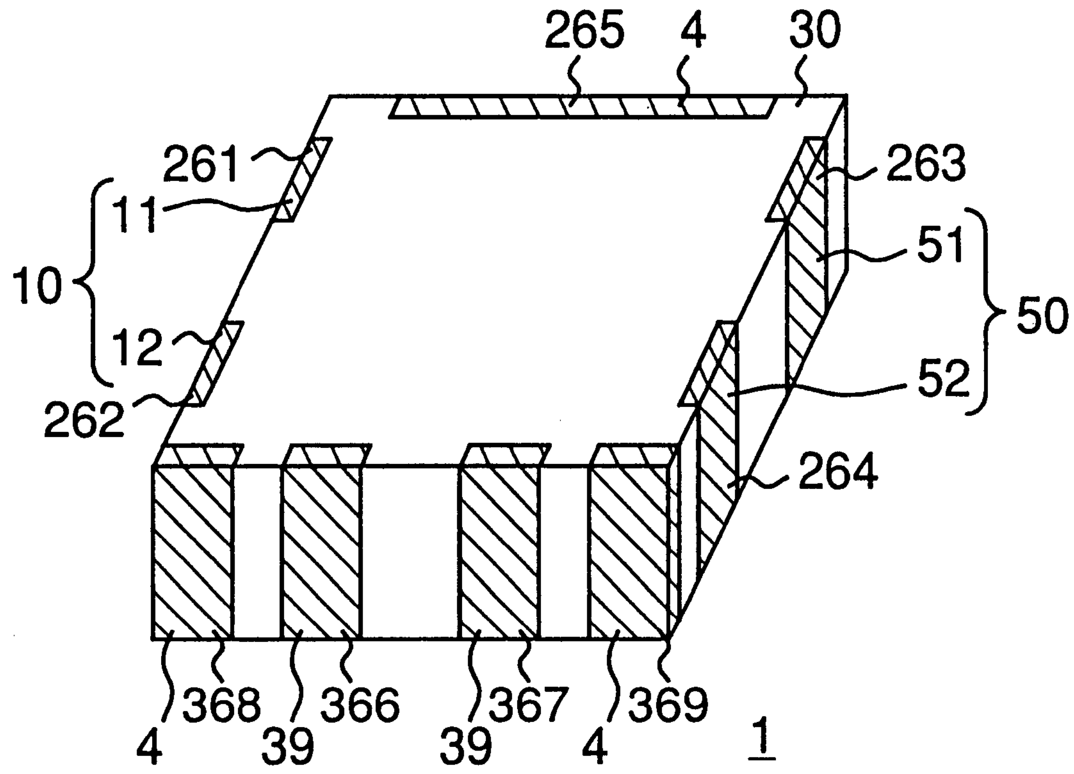
FIG. 7 is a view similar to FIG. 3 showing the structure of the balanced dielectric filter in accordance with the embodiment of the present invention.

FIG. 7 is an exploded view of a ceramic-multilayered filter according to this embodiment showing an arrangement of strip lines and electrodes on every sheet in the dielectric filter. In the filter 1 having the shape of a rectangular parallelepiped, the input terminals 11, 12 used in a pair and formed of the electrodes 261, 262, respectively, are attached to the end surface of one side of the filter. The output terminals 51, 52 used in a pair and formed of the electrodes 263, 264, respectively, are attached to the end surface of the opposite side. The grounding terminals 4 comprising the grounding electrodes 265, 368 and 369 are formed on the end surfaces of the remaining sides. In the case when this filter 1 is used, the electrodes 261, 262 and the electrodes 263, 264 thereof are secured by soldering to corresponding electrodes located at predetermined positions on a circuit board.

Furthermore, on the end surface of one side of the dielectric filter 1, the short-circuit electrode 366 is formed to short between the end of one of the two narrow line portions 211 and the end of one of the two narrow line portions 221, and the short-circuit electrode 367 is formed to short between the end of the other narrow line portion 211 and the end of the other narrow line portion 221.

This embodiment is significantly different from the first embodiment in that, instead of grounding the end of each resonating element, the end of a quarter-wavelength resonating element is connected to the end of the other quarter-wavelength resonating element disposed therebelow to form a nearly half-wavelength resonator. As a result, the resonating elements are floated from the grounding potential.

By forming the half-wavelength resonator by electrically connecting the resonating elements as described above, it is possible to attain a filter being excellent in filter characteristics and compact in size. In addition, even if variations are present between the upper and lower resonating elements, balanced conditions can be attained automatically, since there is no point to be forcibly grounded on the resonating elements. The filter can thus have excellent characteristics at all times.

Since this filter is not provided with the intermediate shield electrode 371 (see FIG. 8), the filter can be produced simply. Furthermore, since no high-frequency current flows to the intermediate shield electrode 371, a loss due to such current can be eliminated, and the passing characteristics of the filter can be improved.

As described above, the present embodiment provides outstanding effects of simplifying filter production, eliminating filter loss, and improving filter characteristics.

Embodiment 4

Figure 8:
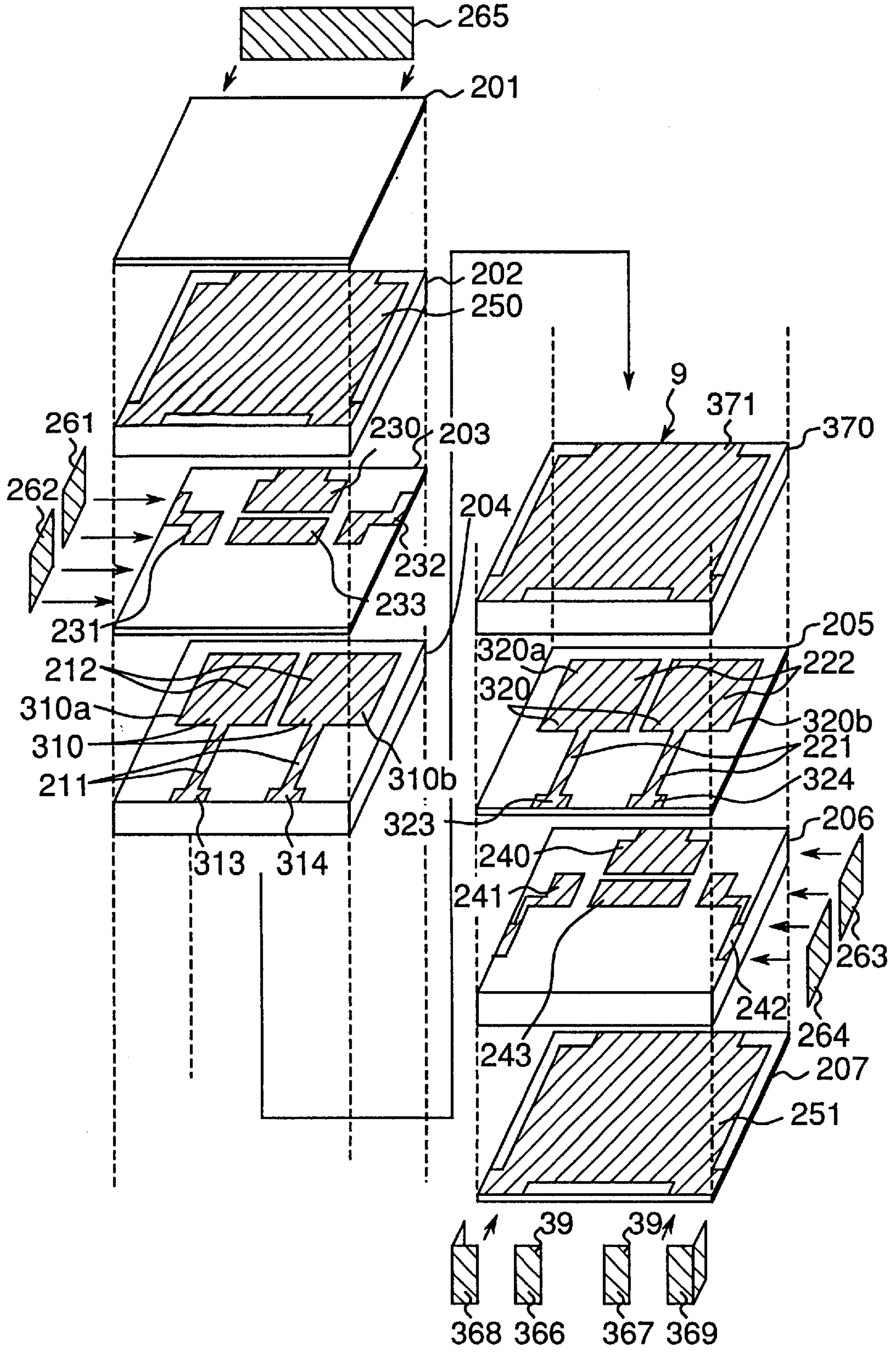
FIG. 8 is a view similar to FIG. 2 showing a balanced dielectric filter in accordance with still yet another embodiment of the present invention.
Figure 9A:
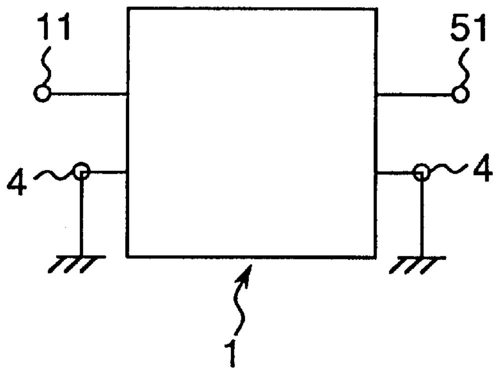
Fig.9A (PRIOR ART)
FIG. 9A is a view showing the connections of the terminals of a conventional dielectric filter.
Figure 9B:
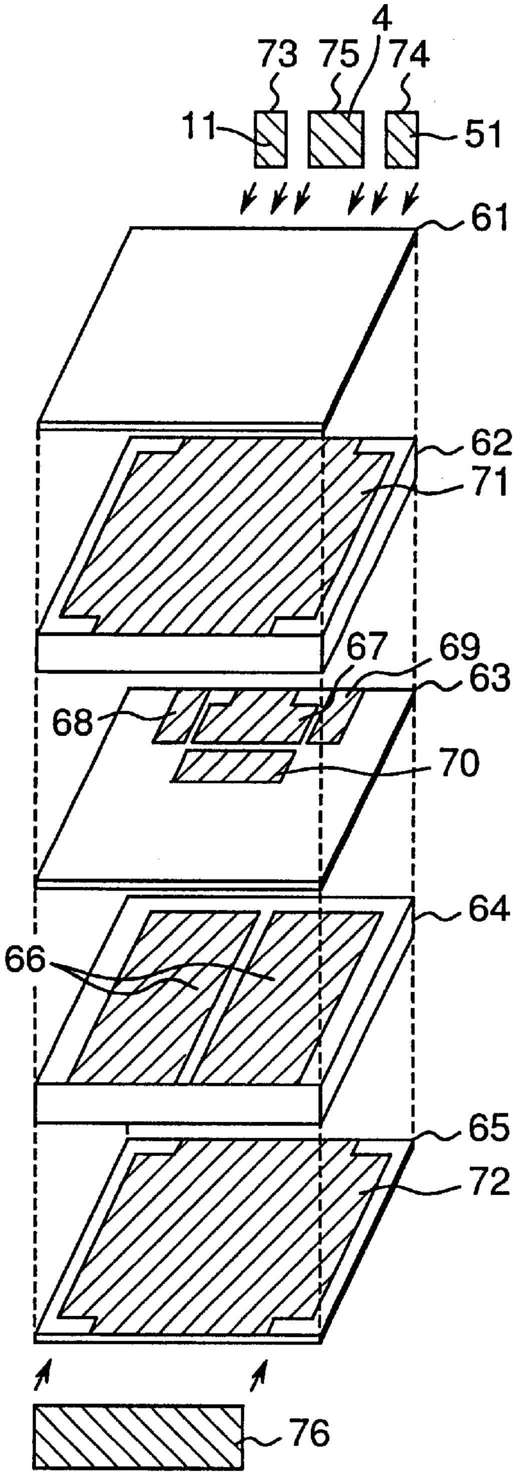
Fig.9B (PRIOR ART)
FIG. 9B is an exploded view showing the structure of the conventional dielectric filter; and, FIG. 10 is a circuit diagram of the conventional dielectric filter.
Figure 10:
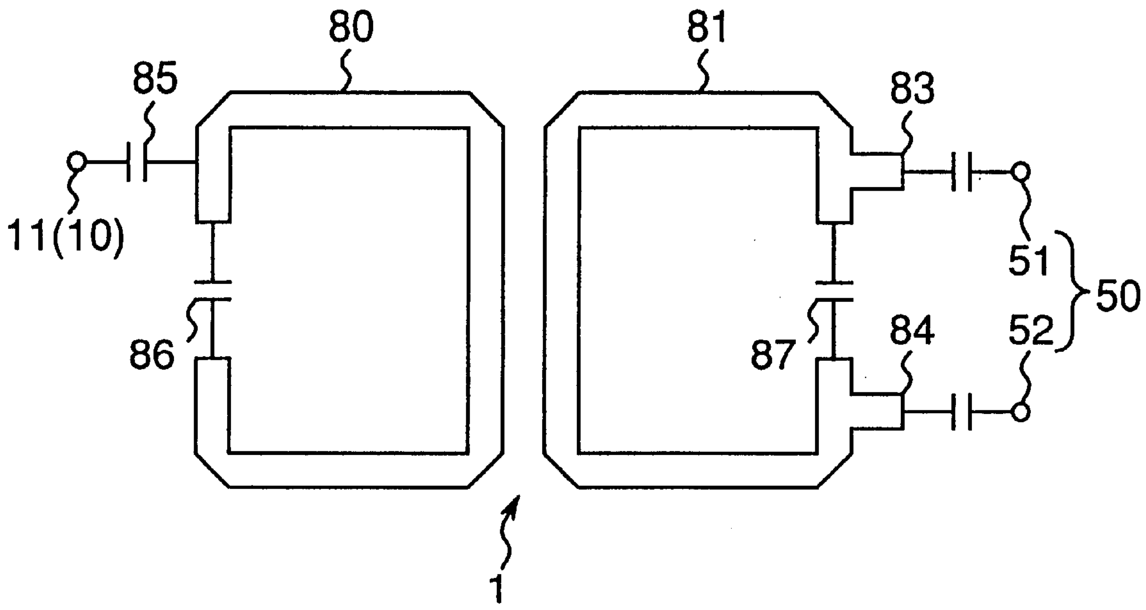
Fig.10 (PRIOR ART)

FIG. 8 is a view showing a structure of a balanced dielectric filter having balanced input/output terminals in accordance with a fourth embodiment of the present invention. The balanced dielectric filter of the present embodiment is the same as the balanced dielectric filter of the third embodiment except that an intermediate shield electrode 371 used to act as an electric wall is provided between the resonators 310 and 320 of the dielectric filter of the third embodiment.

The intermediate shield electrode 371 is located between upper and lower resonating elements 310*a* and 320*a* and between upper and lower resonating elements 310*b* and 320*b*, and is connected to a grounding electrode 266 so as to be grounded, thereby acting as an electric wall 9. Since this dielectric filter is symmetrical electrically in the vertical direction with respect to the intermediate shield electrode 371, the filter functions as a completely balanced dielectric filter as viewed from the input/output terminals thereof.

As described above, the balanced dielectric filter of the present invention has two resonators, each comprising plural TEM mode resonating elements, disposed in parallel and mutually coupled electromagnetically. The two resonators are connected so as to be balanced and parallel between a pair of input terminals and a pair of output terminals, and the resonators are disposed in parallel and symmetrical so as to be mirror images of each other. As a result, both the input and output sides of the filter are balanced completely, and the filter is completely shielded against external electromagnetic interference, thereby preventing adverse effects due to the interference from being produced on both the input and output sides.

The filter comprises a pair of input terminals, resonators, each comprising plural TEM mode resonating elements, disposed in parallel and mutually coupled electromagnetically and both the input side ends of the resonators being connected to the input terminals, respectively, and a pair of output terminals connected to both the output side ends of the resonators, respectively. Each resonator is in a bent form so that the resonating elements thereof are mirror images of each other. Therefore, just as described above, the input and output sides of the filter are balanced completely, and the filter is completely shielded against external electromagnetic interference, thereby preventing adverse effects due to the interference from being produced on both the input and output sides.

Since the TEM mode resonating elements are located on dielectrics to form a strip-line resonator, it is possible to obtain a filter being very compact in size and excellent in mass production capability.

In addition, the above-mentioned resonator is formed as a quarter-wavelength resonator by grounding the ends of the strip lines thereof. Or the above-mentioned resonator is formed as a half-wavelength resonator by connecting the ends of the strip lines being symmetrical to each other. In both types of these resonators, filters nearly as large as a quarter-wavelength filter can be obtained.

Since the two strip-line resonators are embedded in dielectric layers, the resonators can be held at predetermined positions. In addition, by using ceramics with a high dielectric constant, the strip-line resonators can be shortened, whereby dielectric filters can be made compact.

Furthermore, between the resonators being mirror images of each other, the electric wall is formed near a plane of symmetry, and in particular, a grounded conductor is located between the resonators. As a result, the balanced dielectric filter is balanced completely, whereby the filter can function as a filter highly resistant against electromagnetic interference.

Furthermore, the balanced dielectric filer according to the present invention may be used as an unbalanced input-balanced output filter. In this case, one of the pair of the input terminals may be connected with another unbalanced circuit, and the other input terminal is unconnected free, or, preferably, grounded to a grounded terminal. Signals from the circuit are applied between the input terminal and the grounded terminal. Alternatively, as a balanced-unbalanced filter the balanced dielectric filter may be used for connecting the unbalanced output terminals to another unbalanced circuit. The filters to be used for such unbalanced-balanced filtration have the same configuration of the resonators as shown in FIGS. 2, 5, 6 and 8, the difference being only in a method of wiring to outer circuits, which are balanced or unbalanced.

What is claimed is:

1. A balanced dielectric filter comprising:

a pair of resonators disposed separately in a dielectric, each resonator including first to Nth TEM mode resonating elements mutually coupled in series electromagnetically, wherein N is 2 or more, said resonators oriented to face each other such that the first to Nth TEM mode resonating elements of one of the pair of resonators face the first to Nth TEM mode resonating elements, respectively, of the other of the pair of resonators in a mirror symmetry in the dielectric;

a pair of input terminals connected to the first TEM mode resonating elements of the pair of resonators, respectively; and a pair of output terminals connected to the Nth TEM mode resonating elements of the pair of resonators, respectively.

2. The balanced dielectric filter according to claim 1, wherein each said TEM mode resonating element comprises a strip line formed of a thin conductor film embedded in a dielectric.

3. The balanced dielectric filter according to claim 2, wherein each said TEM mode resonating element is a quarter-wavelength resonating element formed of a strip line, one end of which is connected to a grounding conductor.

4. The balanced dielectric filter according to claim 2, wherein the strip lines of each of said pair of resonators, being symmetrical to each other, are connected to each other at one ends thereof to form a half-wavelength resonator.

5. The balanced dielectric filter according to claim 1, further comprising a grounded shielding conductor located on a symmetry plane between said resonators.

6. The balanced dielectric filter according to claim 4, wherein said TEM mode resonating elements are located on both sides of a ceramic layer in a dielectric ceramic-multilayered structure to be isolated from each other.

7. The balanced dielectric filter according to claim 6, wherein both ends of said TEM mode resonating elements of the pair of resonators are exposed to an end surface of said dielectric ceramic-multilayered structure and connected to a grounded conductor electrode attached on said end surface, thereby forming a quarter-wavelength resonator.

8. The balanced dielectric filter according to claim 6, wherein both ends of said TEM mode resonating elements of the pair of resonators are exposed to an end surface of said dielectric ceramic-multilayered structure and connected to a non-grounded conductor electrode attached on said end surface, thereby forming a half-wavelength resonator.

9. The balanced dielectric filter according to claim 6, further comprising a grounded shield conductor layer located on a mirror-symmetry plane within the dielectric layer between said resonators.

10. The balanced dielectric filter according to claim 1 wherein one terminal of at least one pair of the input and output terminals is connected to another unbalanced circuit and the other terminal is grounded.

11. The balanced dielectric filter according to claim 3, wherein said TEM mode resonating elements are located on both sides of a ceramic layer in a dielectric ceramic-multilayered structure to be isolated from each other.

12. The balanced dielectric filter according to claim 11, wherein both ends of said TEM mode resonating elements of the pair of resonators are exposed to an end surface of said dielectric ceramic-multilayered structure and connected to a grounded conductor electrode attached on said end surface, thereby forming a quarter-wavelength resonator.

13. The balanced dielectric filter according to claim 11, wherein both ends of said TEM mode resonating elements of the pair of resonators are exposed to an end surface of said dielectric ceramic-multilayered structure and connected to a non-grounded conductor electrode attached on said end surface, thereby forming a half-wavelength resonator.

14. The balanced dielectric filter according to claim 11, further comprising a grounded shield conductor layer located on a mirror-symmetry plane within the dielectric layer between said resonators.

15. The balanced dielectric filter according to claim 2, wherein said TEM mode resonating elements are located on both sides of a ceramic layer in a dielectric ceramic-multilayered structure to be isolated from each other.

16. The balanced dielectric filter according to claim 15, wherein both ends of said TEM mode resonating elements of the pair of resonators are exposed to an end surface of said dielectric ceramic-multilayered structure and connected to a grounded conductor electrode attached on said end surface, thereby forming a quarter-wavelength resonator.

17. The balanced dielectric filter according to claim 15, wherein both ends of said TEM mode resonating elements of the pair of resonators are exposed to an end surface of said dielectric ceramic-multilayered structure and connected to a non-grounded conductor electrode attached on said end surface, thereby forming a half-wavelength resonator.

18. The balanced dielectric filter according to claim 15, further comprising a grounded shield conductor layer located on a mirror-symmetry plane within the dielectric layer between said resonators.

* * * * *